United States Patent [19]
Ito

[11] Patent Number: 5,414,659
[45] Date of Patent: May 9, 1995

[54] SEMICONDUCTOR MEMORY DEVICE HAVING ADDRESS TRANSITION DETECTOR QUICKLY ENABLING REDUNDANCY DECODER

[75] Inventor: Munehiro Ito, Tokyo, Japan

[73] Assignee: NEC Corporation, Tokyo, Japan

[21] Appl. No.: 123,258

[22] Filed: Sep. 20, 1993

[30] Foreign Application Priority Data

Sep. 24, 1992 [JP] Japan .................................. 4-255058

[51] Int. Cl.$^6$ .............................................. G11C 29/00
[52] U.S. Cl. .................................... 365/200; 365/225.7;
365/233.5; 327/1; 327/526; 326/10; 326/106
[58] Field of Search ................... 365/200, 225.7, 233.5,
365/96; 307/202.1, 441

[56] References Cited

U.S. PATENT DOCUMENTS

| | | | |
|---|---|---|---|
| 4,689,494 | 8/1987 | Chen | 365/200 X |
| 4,817,056 | 3/1989 | Furutani | 365/200 |
| 4,922,134 | 5/1990 | Hoffmann | 365/225.7 X |
| 5,239,511 | 8/1993 | Oh | 365/225.7 X |
| 5,258,953 | 11/1993 | Tsujimoto | 365/200 |
| 5,282,165 | 1/1994 | Mijake | 365/200 |
| 5,289,417 | 2/1994 | Ooishi | 365/200 |
| 5,293,339 | 3/1994 | Suzuki | 365/200 |

FOREIGN PATENT DOCUMENTS

0469571 2/1992 European Pat. Off. .
63-037899 2/1988 Japan .
2209858 5/1989 United Kingdom .

Primary Examiner—Joseph A. Popek
Assistant Examiner—Son Mai
Attorney, Agent, or Firm—Sughrue, Mion, Zinn, Macpeak & Seas

[57] ABSTRACT

A plurality of address transition detecting circuits incorporated in a semiconductor memory device monitors address bits to see whether or not at least one address bits is changed in logic level for producing an address transition signal from the output signals of the respective address transition detecting circuits, and a plurality of charging transistors coupled in parallel between a power voltage line and a decoding line are respectively gated by the output signals of the address transition detecting circuits for charging the decoding line so that a decoding circuit quickly determines whether or not the stored address is matched with the address represented by the address bits for replacing a defective row of regular memory cells with a row of redundant memory cells.

4 Claims, 7 Drawing Sheets

SEMICONDUCTOR MEMORY DEVICE HAVING ADDRESS TRANSITION DETECTOR QUICKLY ENABLING REDUNDANCY DECODER

FIELD OF THE INVENTION

This invention relates to a semiconductor memory device and, more particularly, to a semiconductor memory device having an address transition detector enabling a redundancy decoder at early timing for accelerating a data access.

DESCRIPTION OF THE RELATED ART

Figure 1:
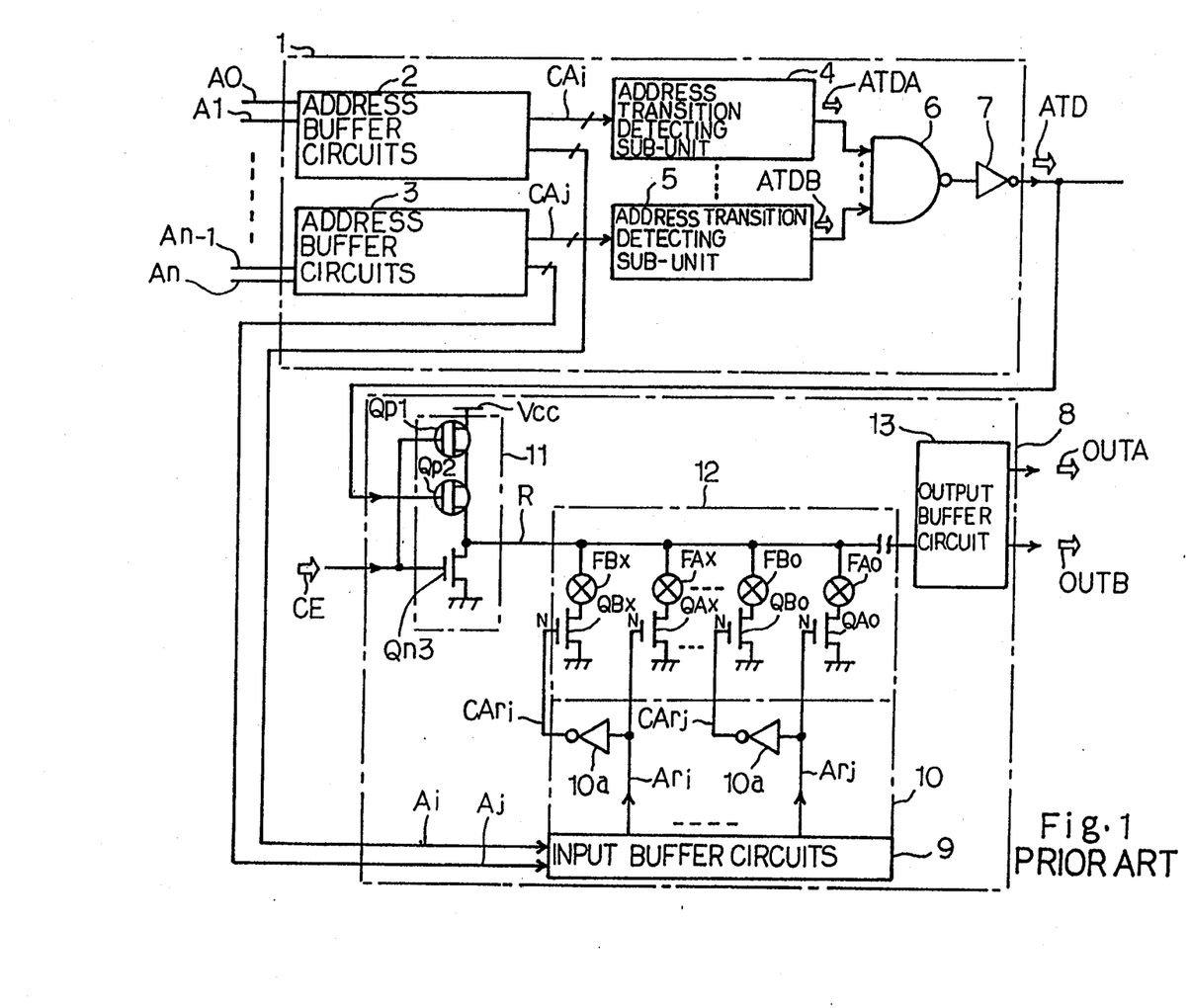
FIG. 1 is a circuit diagram showing the prior art address transition detector unit and the prior art redundancy decoder unit.

A typical example of the address transition detector is illustrated in FIG. 1 of the drawings, and external address bits A0, A1, ..., An−1 and An are supplied to the address transition detector unit 1. In this instance, the external address bits A0 to An are indicative of a column address assigned to one of the columns of memory cells incorporated in the semiconductor memory device. In the following description, logic "1" and logic "0" are assumed to be a high voltage level and a low voltage level, respectively.

The address transition detector unit 1 comprises two groups of address buffer circuits 2 and 3, two address transition detecting sub-units 4 and 5 forming an address transition detecting unit, a two-input NAND gate 6 and an inverter 7, and the external address bits A0 to An are selectively transferred to the two groups of address buffer circuits 2 and 3. The address buffer circuits 2 and 3 produce address predecoded signals from the external address bits A0 to An, and the address predecoded signals are constituted by non-inverted signals Ai and Aj identical in logic level with the external address bits A0 to An and the complementary signals thereof CAi and CAj. The non-inverted signals Ai and Aj are supplied to a redundancy decoder unit 8 as will be described hereinbelow in detail, and the complementary signals CAi ad CAj are respectively supplied to the address transition detecting sub-units 4 and 5.

Each of the address transition detecting sub-units 4 and 5 monitors the complementary signals CAi or CAj, and keeps the output node thereof at the high voltage level as long as the associated complementary signals are constant in logic level. On the other hand, each of the address transition detecting circuits 4 and 5 produces a one-shot pulse signal ATDA or ATDB of the active low voltage level indicative of an address transition when at least one of the associated non-inverted signals changes the logic level.

The reasons why the detection of at least one address transition is shared between the address transition detecting sub-units 4 and 5 are as follows. First, the address pins A0 to An are spread along an edge of the semiconductor chip where the prior art dynamic random access memory device is fabricated, and the address pins at both side positions are too far to regulate the skew if the address transition is detected by a single address transition detector. Second, the detection of address transition on (n+1)/2 expects an internal logic circuit of each address transition detecting sub-unit 4 or 5 to have relatively small current driving capability, and the internal logic circuit can be fabricated by a small circuit components, thereby decreasing a total amount of real estate to be occupied. Third, the separation of the address transition unit into the two sub-units 4 and 5 enhances reliability of the detection. Namely, when one of the address bits A0 to An changes the logic level, the associated address transition circuit produces an extremely narrow pulse, and relatively short wiring between the address transition circuit and the internal logic gate propagates the extremely narrow pulse without deformation. Finally, the internal logic gate of each address transition sub-unit 4 or 5 has a small number of inputs, and can complete the logical function within relatively short time period. Thus, it is necessary for the circuit designer to separate the address transition detecting unit into a plurality of sub-units, and, accordingly, the two address transition detecting sub-units 4 and 5 are accompanied with the NAND gate 6.

The address transition detecting sub-units 4 to 5 are connected with the two-input NAND gate 6, and the NAND gate 6 maintains the output signal at the logic "0" level without any address transition. However, when one of the address transition detecting sub-units 4 and 5 produces the one-shot pulse signal ATDA or ATDB at address transition of at least one address bits, the NAND gate 6 changes the output signal from logic "0" level to logic "1" level, and the inverter changes an address transition signal ATD from the high voltage level to the low voltage level. The address transition signal ATD is supplied to a data read/write circuit (not shown) and the redundancy decoder unit 8.

The redundancy decoder unit 8 comprises input buffer circuits 9, a predecoding circuit 10, a precharging circuit 11, a decoding circuit 12 and an output buffer circuit 13. The non-inverted signals Ai to Aj are supplied to the input buffer circuits 9, and are temporally stored therein. The input buffer circuits 9 produce non-inverted signals Ari to Arj identical in logic level with the non-inverted signals Ai to Aj, and supplies the non-inverted signals Ari to Arj to the predecoding circuit 10 and the decoding circuit 12. The predecoding circuit 10 is implemented by a plurality of inverters 10a, and produces the complementary signals CAri to CArj from the non-inverted signals Ari to Arj. The complementary signals CAri to CArj are supplied to the decoding circuit 12.

The decoding circuit 12 comprises a plurality pairs of fuse elements FA0/FB0 to FAx/FBx connected in parallel with a decoding line R, and a plurality pairs of n-channel enhancement type switching transistors QA0/QB0 to QAx/QBx connected in parallel between the fuse elements FA0/FB0 to FAx/FBx and a ground voltage line. The non-inverted signals Ari to Arj are respectively paired with the complementary signals CAi to CAj, and the plurality pairs of signals Ari/CAri to Arj/ CArj are respectively associated with the plurality pairs of n-channel enhancement type switching transistors QA0/QB0 to QAx/QBx. The plurality pairs of signals Ari/CAri to Arj/CArj are supplied to the gate electrodes of the plurality pairs of n-channel enhancement type switching transistors QA0/QB0 to QAx/QBx, and the decoder circuit 12 checks a column address memorized therein to see whether or not the column address indicated by the non-inverted signals Ai to Aj is consistent with the memorized column address.

The fuse elements FA0/FB0 to FAx/FBx are selectively broken so as to memorize the column address assigned to a defective column of memory cells replaced with a column of redundant memory cells. In detail, while the semiconductor memory device is being subjected to inspections before delivery from the manufacturing factory, the memory cell array is checked to see whether or not a defective memory cell is incorporated therein. If the defective memory cell is found, the column of memory cells including the defective memory cell is replaced with a column of redundant memory cells for rescuing the semiconductor memory device. The replacement is carried out by selectively breaking the fuse elements FA0 to FAx and FB0 to FBx in accordance with the column address assigned to the defective column of memory cells. Namely, the plurality pairs of signals Ai/CAi to Aj/ CAj are respectively assigned to the plurality pairs of fuse elements FA0/FB0 to FAx/FBx, and logic "1" bit and logic "0" bit are respectively memorized by a broken fuse element FA0, . . . or FAx and a broken fuse element FB0, . . . or FBx. For example, if the column address of a defective column is represented by a bit string including the least significant bit of logic "0" and the most significant bit of "1", the fuse elements FB0 and FAx are broken, but the associated fuse elements FA0 and FBx are not broken. Therefore, if the column address indicated by the non-inverted signals Ai to Aj is matched with the column address memorized in the decoding circuit 12, any current path does not take place from the decoding line R to the ground voltage line. However, if the column address is different from the column address memorized therein, at least one current path is established between the decoding line R and the ground voltage line.

The precharging circuit 11 is implemented by a series circuit of two p-channel enhancement type switching transistors Qp1 and Qp2 and an n-channel enhancement type switching transistor Qn3 coupled between a positive power voltage line Vcc and the ground voltage line. The address transition signal ATD is applied to the gate electrode of the p-channel enhancement type switching transistor Qp2, and an internal chip enable signal CE indicative of selection of the semiconductor memory device is supplied to the gate electrode of the p-channel enhancement type switching transistor Qp1 and the gate electrode of the n-channel enhancement type switching transistor Qn3. While the internal chip enable signal CE is staying in the inactive high voltage level, the decoding line R is discharged through the n-channel enhancement type switching transistor Qn3. However, the decoding line R is charged to the positive power voltage level in the concurrent presence of the internal chip enable signal CE of the active low voltage level and the address transition signal ATD of the active low voltage level.

The output buffer circuit 13 is connected with the decoding line R, and monitors the voltage level on the decoding line R. If the decoding line R is maintained at the positive power voltage level, the output buffer circuit 13 supplies an enable signal OUTA and a disable signal OUTB to a redundant column decoding unit (not shown) and a main column address decoding unit (also not shown). Then, the column of redundant memory cells becomes accessible instead of the defective column of memory cells.

The redundancy decoder unit 8 thus arranged behaves as follows. Assuming now that the defective column of memory cells is assigned the column addresses represented by the address predecoded signals including the address predecoded signal Ari of logic "1" level, an external device changes the logic level of one of the external address bits A0 to An so as to access a data bit stored in the defective column of memory cells, and the address buffer circuits 2 and 3 accordingly change one of the non-inverted signals Ai. The non-inverted signals Ai to Aj are latched by the input buffer circuits 9, and the predecoding circuit 10 produces the address predecoded signal Ari/CARi to Arj/CArj at time t1 of FIG. 2.

Figure 2:
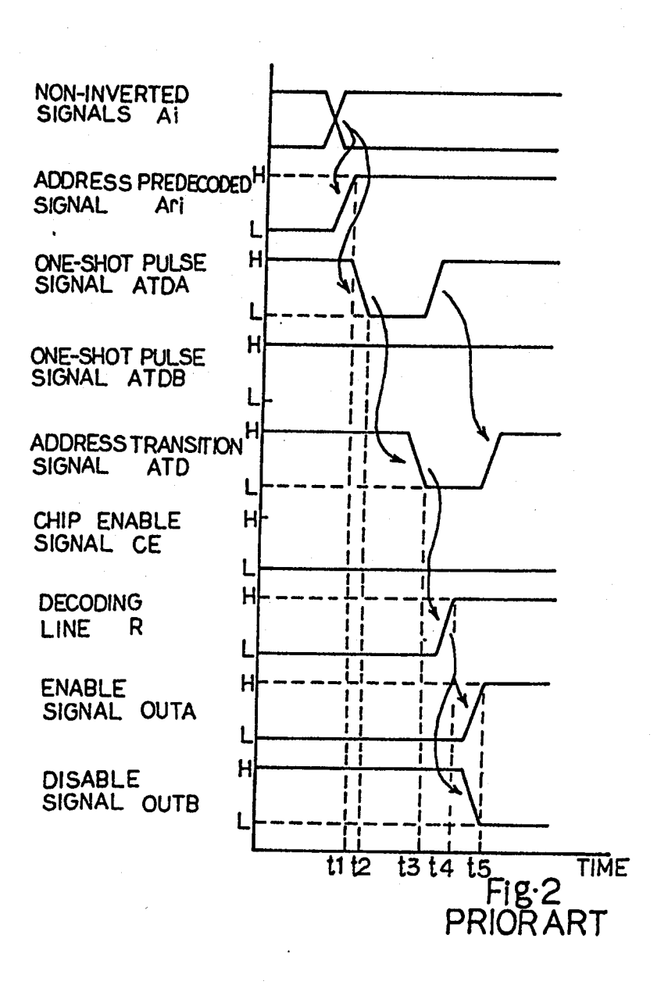
FIG. 2 is a diagram showing the prior art sequence of replacement of the defective row of memory cells with the row of redundant memory cells.

The address buffer circuits 2 and 3 further supply the complementary signals CAi and CAj to the address transition detecting sub-units 4 and 5, respectively, and the address transition detecting sub-unit 4 acknowledges the address transition to the column address assigned to the defective column of memory cells. Then, the address transition detecting sub-unit 4 produces the one-shot pulse of the active low voltage level at time t2. However, the external address bits applied to the address buffer circuits 3 are not changed, and the address transition detecting sub-unit 5 keeps the output node thereof at the high voltage level. The input nodes of the NAND gate 6 are set to logic "1" level and logic "0" level, and the NAND gate 6 changes the output node thereof to logic "1" level. Accordingly, the inverter 7 changes the address transition signal ATD to logic "0" level corresponding to the low voltage level at time t3.

Since the internal chip enable signal CE has been already changed to the low voltage level, the p-channel enhancement type switching transistor Qp1 is turned on, and the n-channel enhancement type switching transistor Qn3 is turned off. The address transition signal ATD allows the p-channel enhancement type switching transistor Qp2 to supply current to the decoding line R, and the decoding line R goes up to the high voltage level at time t4.

Even though the address predecoded signals Arj-/CArj to Ari/CAri cause the n-channel enhancement type switching transistors QA0/QB0 to QAx/QBx to selectively turn on, the n-channel enhancement type switching transistors in the on-state are associated with the broken fuse elements, and the non-broken fuse elements are connected with the n-channel enhancement type switching transistors in the off-state. For this reason, the decoding line R is isolated from the ground voltage line by means of the broken fuse elements and the n-channel enhancement type switching transistors in the off-state, and is maintained at the precharged level.

The output buffer circuit 13 produces the enable signal OUTA of the active high voltage level and the disable signal OUTB of the active low voltage level at time t5, and the auxiliary column address decoder unit causes the row of redundant memory cells to become accessible. On the other hand, the main column address decoder unit is disabled, and makes the defective column of memory cells non-accessible.

Figure 3:
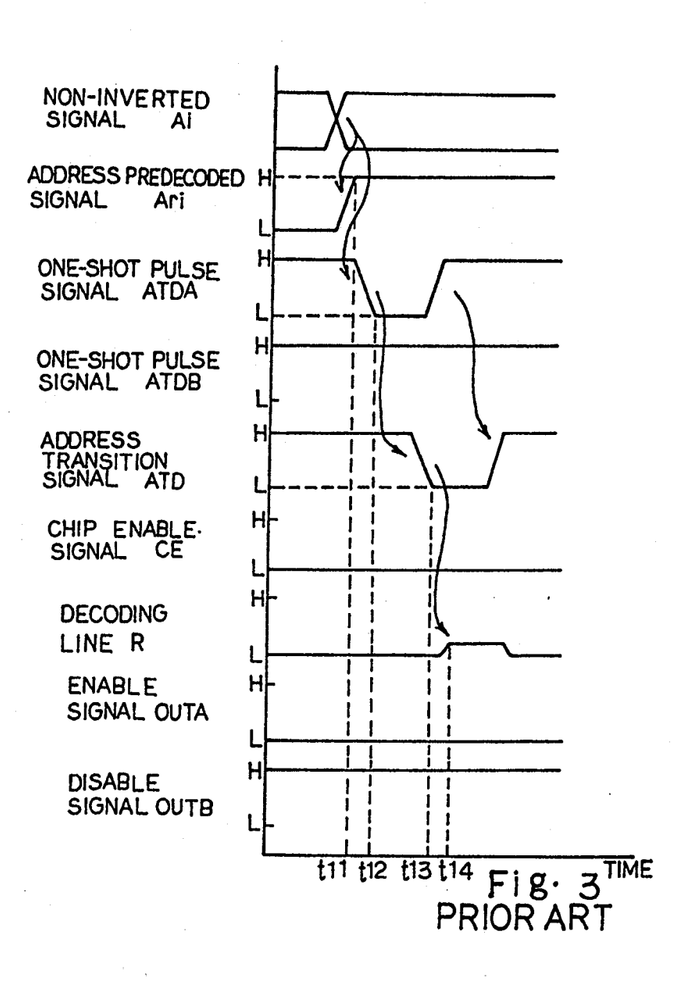
FIG. 3 is a diagram showing the prior art sequence of non-replacement with the row of redundant memory cells.

On the other hand, if the external device accesses a data bit stored in a column of excellent memory cells not replaced with any redundant memory cells, the address transition unit and the redundancy decoder unit 8 behave as illustrated in FIG. 3.

The external address bits A0 to An are changed to indicate the column address assigned to the column of excellent memory cells, and the address buffer circuits 2 and 3 supply the non-inverted signals Ai to Aj to the input buffer circuits 9. The predecoding circuit 10 produces the address predecoded signal Ari/CARi to Arj-/CArj at time t11.

The address buffer circuits 2 and 3 further supply the complementary signals CAi to CAj to the address transition detecting sub-units 4 and 5, respectively, and the address transition detecting sub-unit 4 acknowledges the address transition to the new block and row addresses. Then, the address transition detecting sub-unit 4 produces the one-shot pulse signal ATDA of the active low voltage level at time t12. However, the external address bits applied to the address buffer circuits 3 are not changed, and the address transition detecting sub-unit 5 keeps the output nodes thereof at the high voltage level.

The input nodes of the NAND gate 6 are set to logic "1" level and logic "0" level, and the NAND gate 6 changes the output node thereof to logic "1" level. Accordingly, the inverter 7 changes the address transition signal ATD to logic "0" level at time t13.

Although the address transition signal ATD allows the p-channel enhancement type switching transistor Qp2 to supply current to the decoding line R, at least one current path is established from the decoding line R to the ground voltage line, because the address predecoded signal allows the n-channel enhancement type switching transistor connected with the non-broken fuse element to turn on. As a result, the at least one current path pulls the decoding line R down, and the decoding line R is balanced at a relatively low voltage level at time t14. For this reason, the enable signal OUTA remains in the inactive low voltage level, and the disable signal OUTB also remains in the inactive high voltage level. The main column address decoder unit (not shown) allows the column of excellent memory cells to become accessible, and any redundant bit line pair is not selected by the auxiliary column address decoder unit (not shown).

Thus, the prior art address transition detector unit discriminates an address transition, and causes the redundancy decoder unit 8 to check the column address stored therein to see whether or not the new column addresses indicated by the external address bits are consistent with the column address assigned to the defective column.

However, a problem is encountered in the prior art semiconductor memory device in that time decay is introduced in the production of the enable and disable signals OUTA and OUTB. This is because of the fact that the logic gates, i.e., the NAND gate 6 and the inverter 7, produce the single address transition signal ATD from the plurality of output signals of the address transition detecting sub-units 4 to 5, and the logic gates 6 and 7 are indispensable for producing the signal address transition signal ATD.

SUMMARY OF THE INVENTION

It is therefore an important object of the present invention to provide a semiconductor memory device which accelerates an access to stored data.

To accomplish the object, the present invention proposes to connect a plurality of charging transistors directly gated by address transition detecting signals.

In accordance with one aspect of the present invention, there is provided a semiconductor memory device comprising: a) a plurality of regular memory cells arranged in a plurality of addressable regular memory cell groups; b) at least one redundant memory cell group with which one of the plurality of addressable regular memory cell groups is replaced; c) a regular addressing system associated with the plurality of addressable regular memory cell groups, and responsive to address signals indicative of an address assigned to one of the addressable regular memory cell groups for allowing an external device to access data information stored therein; d) an address transition detecting unit having d-1) a plurality of address transition detecting sub-units supplied with the address signals, and operative to check the address signals to see whether or not at least one address signal changes the logic level for producing respective output signals each indicative of a change of the at least one address bit or not, and d-2) a logic unit having a plurality of input nodes respectively coupled with the plurality of address transition detecting sub-units, and producing an address transition signal from the output signals; and e) a redundancy unit associated with the redundant memory cell group, and having e-1) a decoding line, e-2) a precharging circuit having a plurality of charging transistors coupled in parallel between a source of current and the decoding line, the plurality of charging transistors being gated by the output signals of the plurality of address transition detecting sub-units, respectively, e-3) a memory and decoding circuit storing the address of one of the plurality of addressable regular memory cell groups replaced with the at least one redundant memory cell group, and comparing the address indicated by the address signals with the address stored therein to see whether or not the addresses are inconsistent with one another for determining to provide a current path between the decoding line and a constant voltage line or not, and e-4) a means coupled with the decoding line, and allowing the at least one redundant memory cell group to be accessible instead of the aforesaid one of the plurality of addressable regular memory cell groups when the decoding line is electrically isolated from the constant voltage line, the means being further operative to keep the at least one redundant memory cell group non-accessible when the decoding line is coupled through the current path with the constant voltage line.

In accordance with another aspect of the present invention, there is provided a semiconductor memory device comprising: a redundancy decoder associated with an information read-out circuit of buffers; a plurality of address buffers for specifying a read-out address of the buffers; a plurality of address transition detecting circuits respectively associated with the plurality of address buffers, and detecting a change of address signals for producing detecting signals; and a logic circuit for integrating the plurality of address transition detecting circuits, signals on the input side of the logic circuit being used as a precharging signal of the redundancy decoder.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 4:
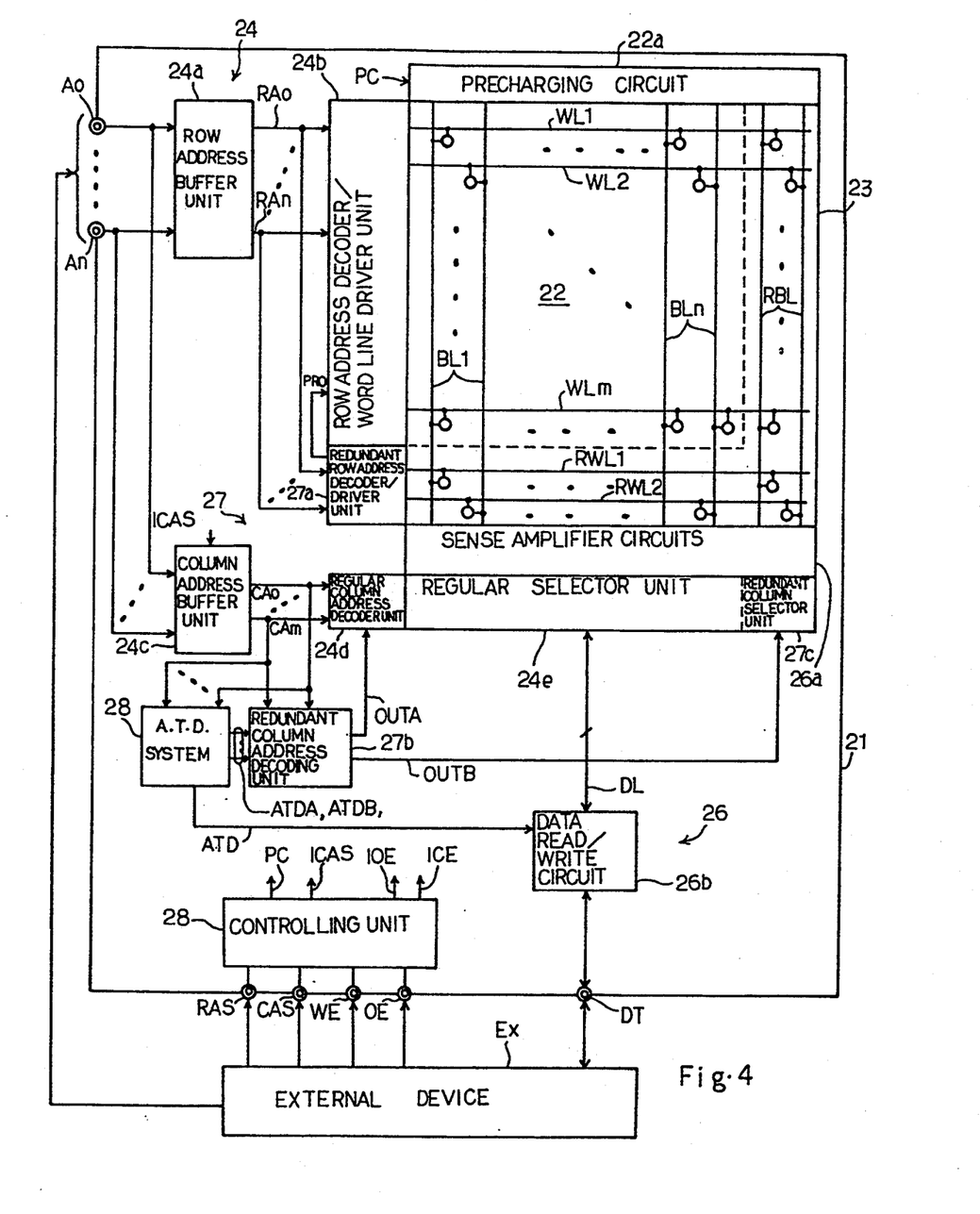
FIG. 4 is a block diagram showing the arrangement of a semiconductor memory device according to the present invention.

Referring to FIG. 4 of the drawings, a semiconductor memory device embodying the present invention is fabricated on a single semiconductor chip 21, and largely comprises a regular memory cell array 22, a redundant memory cell array 23 associated with the regular memory cell array 22, a regular addressing system 24, a data propagating system 26, a redundant addressing system 27 and a controlling unit 28.

The memory cell array 22 is implemented by a plurality of regular memory cells arranged in rows and columns, and the regular memory cells are represented by small circles in FIG. 4. A row address and a column address are assigned to each of the regular memory cells, and, accordingly, each regular memory cell is addressable with the row and column addresses.

A plurality of word lines WL1, WL2 and WLm are respectively associated with the rows of regular memory cells, and a plurality of bit line pairs BL1 to BLn are associated with the columns of regular memory cells for propagating data bits from or to a row of memory cells. A precharging circuit 22a is coupled with the bit line pairs BL1 to BLn, and is responsive to a precharge control signal PC for balancing the bit line pairs at an intermediate voltage level between high and low voltage levels.

The bit line pairs BL1 to BLn are coupled with sense amplifier circuits 26a, and the sense amplifier circuits 26a increase potential differences on the associated bit line pairs BL1 to BLn in magnitude.

Each row of regular memory cells is selected from the regular memory cell array 22a, and, for this reason, each row of regular memory cells serves as an addressable regular memory cell group.

The redundant memory cell array 23 has rows of redundant memory cells sharing the bit line pairs BL1 to BLn with the rows of regular memory cells, and redundant word lines RWL1 and RWL2 are coupled with the rows of redundant memory cells, respectively. A regular word line or a row of regular memory cells is replaceable with one of the redundant word lines RWL1 and RWL2 and, accordingly, with one of the rows of redundant memory cells, and the redundant word lines RWL1 and RWL2 are driven to the active level instead of the word lines replaced therewith.

The redundant memory cell array 23 further has a column of redundant memory cells sharing the regular word lines WL1 to WLm and the redundant word lines RWL1 and RWL2 with the rows of regular memory cells and the rows of redundant memory cells, and a redundant bit line pair RBL is coupled with the column of redundant memory cells. The redundant bit line pair RBL is replaceable with any one of the bit line pairs BL1 to BLn, and one of the redundant memory cells in the column is accessible instead of a regular memory cell in the column replaced therewith. Each of the redundant memory cells is represented by a small circle as similar to the regular memory cell. The precharging circuit 22a charges the redundant bit line pair RBL, and a potential difference on the redundant bit line pair RBL is increased in magnitude by one of the sense amplifier circuits 26a.

The regular addressing system 24 comprises a row address buffer unit 24a connected with address pins A0 to An, a row address decoder/regular word line driver unit 24b connected with the row address buffer unit 29a, a column address buffer unit 24c connected with the address pins A0 to An, a regular column address decoder unit 24d connected with the column address buffer unit 29c and a regular column selector unit 24e controlled by the regular column address decoder unit 24d for coupling one of the bit line pairs BL1 to BLn with a read/write data bus DL.

The row address buffer unit 24a is implemented by a plurality of address buffer circuits (not shown), and row address bits indicative of a row address are supplied from an external device Ex through the address pins A0 to An to the address buffer circuits of the row address buffer unit 24a. The row address bits are temporally stored in the address buffer circuits of the unit 24a, and produces row address predecoded signals RA0 to RAn consisting of non-inverted signals and the complementary signals thereof. The row address decoder/word line driver unit 24b is responsive to the row address predecoded signals RA0 to RAn, and drives one of the associated word lines WL1 to WLm to the active level.

The column address buffer unit 24c is also implemented by a plurality of address buffer circuits (not shown), and column address bits indicative of a column address are supplied from the external device Ex through the address pins A0 to An to the address buffer circuits of the column address buffer unit 24c. The column address bits are temporally stored in the address buffer circuits of the unit 24c, and produces column address predecoded signals CA0 to CAm consisting of non-inverted signals and the complementary signals thereof.

The regular column address decoding unit 24d is responsive to the column address predecoded signals CA0 to CAm, and causes the regular column selector unit 24e to couple one of the bit line pairs BL1 to BLn with the read/write data bus DL.

The data propagating system comprises the sense amplifier circuits 26a coupled with the bit line pairs BL1 to BLn and the redundant bit line pair RBL, the read/write data bus DL and a data read/write circuit 26b. The data read/write circuit 26b is connected with an input/output data pin DT, and supplies an input data signal from and an output data signal to the input/output data pin DT. The data read/write circuit 26b is responsive to an address transition signal ATD supplied from the address transition detecting system 28 in a read-out sequence, and produces the output data signal from a potential difference on the read/write data bus DL. While the semiconductor memory device is carrying out a write-in sequence, the data read/write circuit 26b produces a potential difference from the a write-in data bit indicated by the input data signal, and places the potential difference on the read/write data bus DL.

The redundant addressing system 27 comprises a redundant row address decoder/driver unit 27a connected with the redundant word lines RWL1 and RWL2, a redundant column address decoding unit 27b connected with the column address buffer unit 24c and a redundant column selector unit 27c responsive to an enable signal OUTB from the redundant column address decoding unit 27b for coupling the redundant bit line pair RBL with the read/write data bus DL.

The redundant row address decoder/driver unit 27a memorizes row addresses assigned to two defective rows of regular memory cells each containing at least one defective regular memory cell, and compares the row address represented by the row address predecoded signals RA0 to RAn with the row addresses stored therein. While the row address represented by the row address predecoded signals is inconsistent with the row addresses assigned to the defective rows, the redundant row address decoder/driver unit 27a keeps the redundant word lines RWL1 and RWL2 inactive. On the other hand, if the row address represented by the row address predecoded signals RA0 to RAn is consistent with one of the row addresses stored in the redundant row address decoder/driver unit 27a, the redundant row address decoder/driver unit 27a disables the row address decoder/word line driver unit 24b, and drives the redundant word line RWL1 or RWL2 to the active level, thereby allowing the external device Ex to access a data bit stored in the row of redundant memory cells instead of the defective regular memory cell.

The redundant column address decoding unit 27b also memorizes a column address assigned to a column of regular memory cells containing at least one defective regular memory cell, and produces a disable signal OUTA and the enable signal OUTB when the column address represented by the column address predecoded signals CA0 to CAm is matched with the column address stored therein. The disable signal OUTA is supplied to the regular address decoder unit 24d so that the regular column address decoder unit 24d does not respond to the column address predecoded signal CA0 to CAm. The circuit arrangement of the redundant column address decoding unit 27b will be described in detail together with the address transition detecting system 28.

The redundant column selector 27c blocks the read/write data bus DL from the redundant bit line pair RBL in the absence of the enable signal OUTB, but couples the redundant bit line pair RBL with the read/write data bus DL in the presence of the enable signal. The disable signal OUTA is the complementary signal of the enable signal OUTB, and the regular column selector unit 24e isolates the read/write circuit 26b from all of the bit line pairs BL1 to BLn while the redundant column selector unit 27c interconnects the redundant bit line pair RBL and the read/write data bus DL.

The controlling unit 28 is responsive to external control signals such as a row address strobe signal RAS, a column address strobe signal CAS, a write enable signal WE and an output enable signal OE, and produces various internal control signals such as, for example, the precharge control signal PC and an internal output enable signal. The internal control signals controls the read-out sequence and the write-in sequence.

Figure 5:
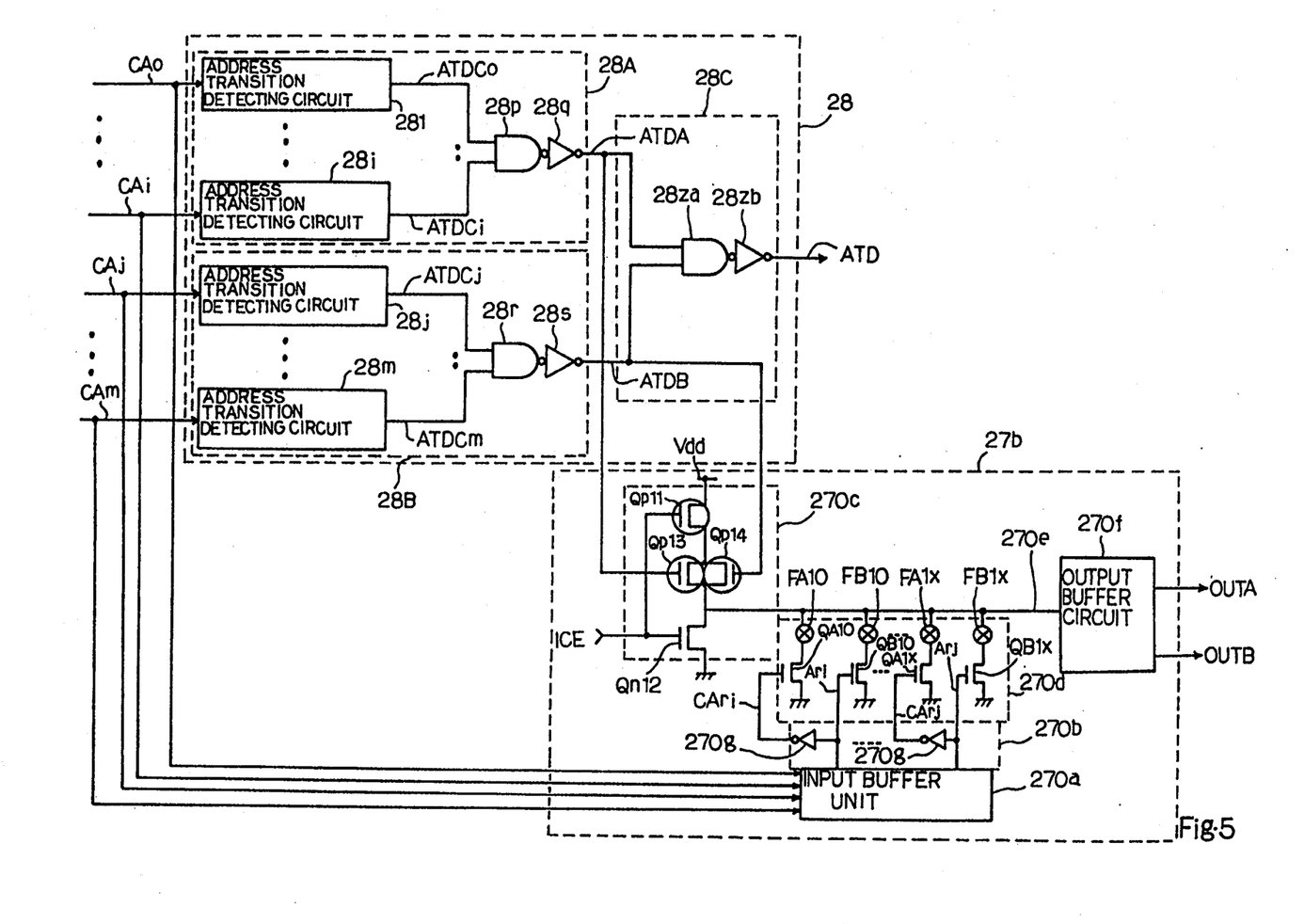
FIG. 5 is a circuit diagram showing an address transition detecting unit and a redundancy decoding unit incorporated in the semiconductor memory device according to the present invention.

As will be better seen from FIG. 5, the address transition detecting system 28 comprises a plurality of address transition detecting sub-units 28A and 28B selectively supplied with the column address predecoded signals CA0 to CAm and a logic unit 28C for producing the address transition signal ATD. The reasons why an address transition is monitored by the two address transition detecting sub-units are similar to those of the prior art semiconductor memory device.

The address transition detecting sub-unit 28A comprises a plurality of address transition detecting circuits 281 to 28i for respectively monitoring the column address predecoded signals CA0 to CAm, a NAND gate 28p having input nodes respectively connected with the address transition detecting circuits 281 to 28i and an inverter 28q for producing an address transition detecting signal ATDA in the form of one-shot pulse signal. When at least one column address predecoded signals CA0 to CAi changes the logic level, the associated address transition detecting circuit produces a one-shot pulse of the active low voltage level, and the NAND gate 28p changes the output node thereof to the active high voltage level, then the inverter 28q supplies the address transition detecting signal ATDA of the active low voltage level to the logic unit 28C and to the redundant column address decoding unit 27b.

The address transition detecting sub-unit 28B also comprises a plurality of address transition detecting circuits 28j to 28m, a NAND gate 28r and an inverter 29s, and the address transition detecting circuits 28j to 28m monitor the column address predecoded signals CAj to CAm, respectively. When at least one column address predecoded signal CAj to CAm changes the logic level, the associated address transition detecting circuit produces a one-shot pulse of the active low voltage level, and the NAND gate 28r changes the output node thereof to the active high voltage level, then the inverter 28s supplies the address transition detecting signal ATDB of the active low voltage level to the logic unit 28C and to the redundant column address decoding unit 27b.

Figure 6:
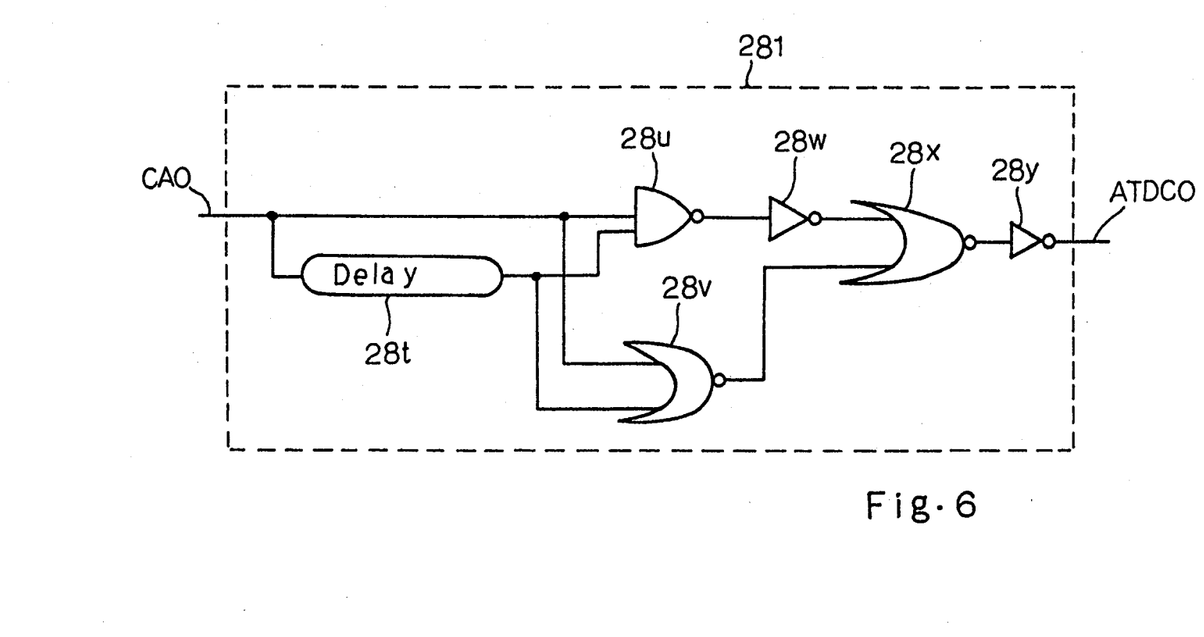
FIG. 6 is a circuit diagram showing an address transition detecting circuit incorporated in the semiconductor memory device according to the present invention.

All of the address transition detecting circuits 281 to 28i are similar to one another, and FIG. 6 illustrates the address transition detecting circuit 281, by way of example. The address transition detecting circuit 281 comprises a delay circuit 28t introducing time delay into the column address predecoded signal CA0, a two-input NAND gates 28u supplied with the column address predecoded signal CA0 and a delayed column address predecoded signal, a two-input NOR gate 28v also supplied with the column address predecoded signal CA0 and the delayed column address predecoded signal, and inverter 28w coupled with the output node of the NAND gate 28s, a two-input NOR gate 28x coupled with the output node of the inverter 28w and the output node of the NOR gate 28v and an inverter 28y for producing the one-shot pulse signal ATDC0.

While the column address predecoded signal CA0 is staying either logic "1" or logic "0" level, both NAND and NOR gates 28u and 28v produces the output signals identical in logic level, and the output signal of the NAND gates 28u is inverted by the inverter circuit 28w. For this reason, the input signals of the NOR gate 28v is different in logic level, and the NOR gate 28x keeps the output signal thereof in logic "0" level. The means that the inverter 28y keeps the output node thereof in logic "1" level.

However, if the column address predecoded signal CA0 changes the logic level, the column address predecoded signal CA0 and the delayed column address predecoded signal becomes different in logic level from each other for time period introduced by the delay circuit 28t, and the NAND gate 28u and the NOR gate 28v produces the output signal of logic "1" level and the output signal of logic "0" level, respectively. Since the inverter 28w changes the output signal of the NAND gate 28u to logic "0" level, both input nodes of the NOR gate 28x becomes logic "0" level, and the NOR gate 28x changes the output signal thereof from logic "0" level to logic "1" level for the time period introduced by the delay circuit 28t. As a result, the inverter 28y produces the one-shot pulse ATDC0 of logic "0" level corresponding to the low voltage level.

Turning back to FIG. 5, the logic gate 28C is implemented by a series of NAND gate 28za and an inverter 28zb, and the address transition signals ATDA and ATDB are supplied to the input nodes of the NAND gate 28za. While the column address predecoded signals CA0 to CAm are constant in logic level, the address transition detecting signals ATDA and ATDB are in logic "1" level, and the NAND gate 28za keeps the output node thereof in logic "0" level. This results in the address transition signal ATD of logic "1" level corresponding to the inactive high voltage level.

However, when at least one of the column address predecoded signals CA0 to CAm changes the logic level, at least one of the address transition detecting signals ATDA and ATDB changes the logic level to logic "0" level, and the NAND gate 28za changes the output node to the logic "1" level. For this reason, the inverter 28zb changes the address transition signal ATD to logic "0" level corresponding to the active low voltage level for the time period introduced by the delay circuit 28t. As described hereinbefore, the address transition signal ATD is supplied to the data read/write circuit 26b, and allows the external device Ex to sequentially access data bits in a high-speed page mode. Namely, the semiconductor memory device according to the present invention is responsive to sequential column address changes without change of the column address strobe signal, and the external device Ex can sequentially access to data bits sharing a row address by only changing the column address.

The redundant column address decoding unit 27b comprises an input buffer unit 270a, a predecoding circuit 270b, a precharging circuit 270c, a decoding circuit 270d, a decoding line 270e and an output buffer circuit 270f. The decoding circuit 270d serves as a memory and decoding circuit, and the output buffer circuit 270f and the redundant column selector unit 27c as a whole constitute a means.

The column address predecoded signals CA0 to CAm are supplied to the input buffer circuits 270a, and are temporally stored therein. The input buffer circuits 270a produce non-inverted signals Ari to Arj identical in logic level with the column address predecoded signals CA0 to CAm, and supplies the non-inverted signals Ari to Arj to the predecoding circuit 270b and the decoding circuit 270d.

The predecoding circuit 270b is implemented by a plurality of inverters 270g, and produces the complementary signals CAri to CArj from the non-inverted signals Ari to Arj. The complementary signals CAri to CArj are supplied to the decoding circuit 270d together with the non-inverted signals Ari to Arj.

The decoding circuit 270d comprises a plurality pairs of fuse elements FA10/FB10 to FA1x/FB1x connected in parallel with the decoding line 270e, and a plurality pairs of n-channel enhancement type switching transistors QA10/QB10 to QA1x/QB1x connected in parallel between the fuse elements FA10/FB10 to FA1x/FB1x and a ground voltage line. The non-inverted signals Ari to Arj are respectively paired with the complementary signals CAi to CAj, and the plurality pairs of signals Ari/CAri to Arj/CArj respectively gate the plurality pairs of n-channel enhancement type switching transistors QA10/QB10 to QA1x/QB1x. Namely, the plurality pairs of signals Ari/CAri to Arj/CArj are supplied to the gate electrodes of the plurality pairs of n-channel enhancement type switching transistors QA10/QB10 to QA1x/QB1x, and the decoder circuit 270d checks a column address memorized therein to see whether or not the column address indicated by the column address predecoded signals CA0 to CAm is consistent with the memorized column address.

The fuse elements FA10/FB10 to FA1x/FB1x are selectively broken so as to memorize the column address assigned to a defective column of regular memory cells replaced with the column of redundant memory cells. In detail, while the semiconductor memory device is being subjected to inspections before delivery from the manufacturing factory, the memory cell array 22 is checked to see whether or not a defective regular memory cell is incorporated therein. If defective regular memory cells are found in one of the columns of regular memory cells, the column of regular memory cells including the defective memory cells is replaced with the column of redundant memory cells for rescuing the semiconductor memory device.

The replacement is carried out by selectively breaking the fuse elements FA10 to FA1x and FB10 to FB1x in accordance with the column address assigned to the defective column of regular memory cells. Namely, the plurality pairs of signals Ai/CAi to Aj/CAj are respectively assigned to the plurality pairs of fuse elements FA10/FB10 to FA1x/FB1x, and logic "1" bit and logic "0" bit are respectively memorized by a broken fuse element FA10, . . . or FA1x and a broken fuse element FB10, . . . or FB1x. For example, if the column address of the defective column is represented by a bit string including the least significant bit of logic "0" and the most significant bit of "1", the fuse elements FB10 and FA1x are broken, and the associated fuse elements FA10 and FB1x are not broken. Therefore, if the column address indicated by the column address predecoded signals CA0 to CAm is matched with the column address memorized in the decoding circuit 270d, any current path does not take place from the decoding line 270e to the ground voltage line. However, if the column address is different from the column address memorized therein, at least one current path is established between the decoding line 270e and the ground voltage line.

The precharging circuit 270c comprises a p-channel enhancement type switching transistor Qp11 coupled with a positive power voltage line Vdd, an n-channel enhancement type switching transistor Qn12 coupled with the ground voltage line, and a parallel combination of p-channel enhancement type charging transistors Qp13 and Qp14 coupled between the switching transistors Qp11 and Qn12. An internal chip enable signal ICE is supplied from the controlling unit 28 to the gate electrode of the p-channel enhancement type switching transistor Qp11 and the gate electrode of the n-channel enhancement type switching transistor Qn12 when the external device EX intends to access data information stored in the semiconductor memory device. The address transition detecting signals ATDA and ATDB are respectively supplied to the gate electrodes of the p- channel enhancement type charging transistors Qp13 and Qp14.

While the internal chip enable signal ICE is staying in the inactive high voltage level, the decoding line 270e is discharged through the n-channel enhancement type switching transistor Qn12, and the redundant column address decoding unit 27b is disabled. On the other hand, the decoding line 270 is charged to the positive power voltage level in the concurrent presence of the internal chip enable signal ICE of the active low voltage level and the address transition detecting signals ATDA and ATDB of the active low voltage level, and the redundant column address decoding unit 27b becomes ready for replacement.

The output buffer circuit 270f is connected with the decoding line 270e, and monitors the voltage level on the decoding line 270e. If the decoding line 270e is maintained at the positive power voltage level, the output buffer circuit 270f supplies the disable signal OUTA and the enable signal OUTB to the regular column address decoder unit 24d and the redundant column selector unit 27c. Then, the redundant column selector unit 27c couples the redundant bit line pair RBL with the read/write data bus DL.

Figure 7:
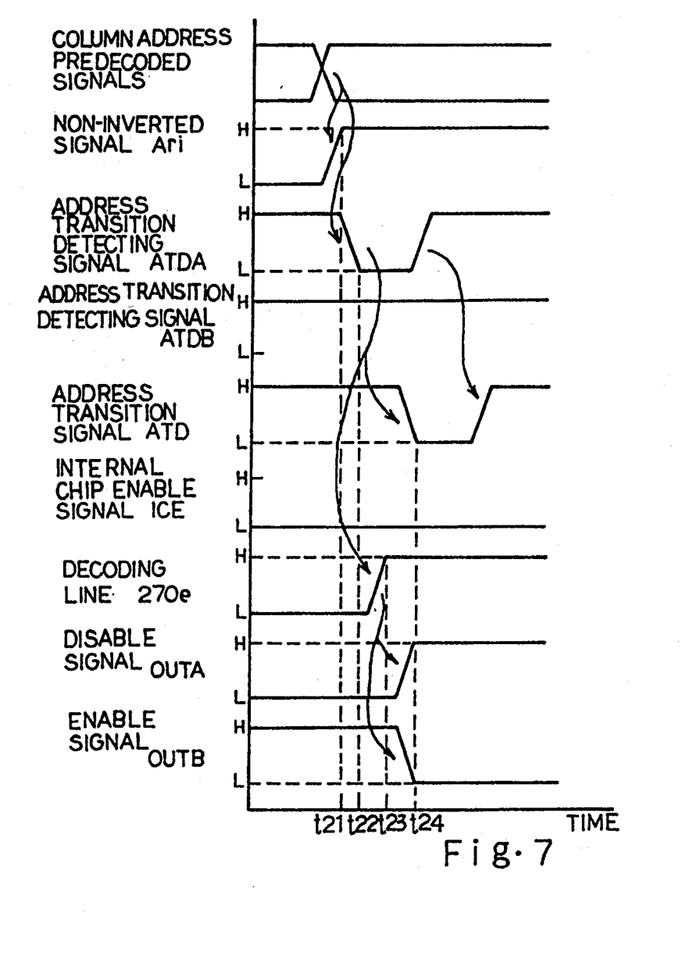
FIG. 7 is a diagram showing a data access sequence on a redundant memory cell according to the present invention.

The data access sequence has a read-out phase and a write-in phase, and the data access sequence in the read-out phase is described hereinbelow with reference to FIGS. 7 and 8. In the followings description, potential differences indicative of read-out data bits are assumed to have been already developed by the sense amplifier circuits 26a.

Assuming now that a defective column of regular memory cells is assigned a column address represented by the column address predecoded signals CA0 to CAm including the address predecoded signal CA0 corresponding to the non-inverted signal Ari of logic "1" level, the external device EX changes the logic level of one of the external column address bits so as to access a data bit stored in the defective column of memory cells, and the column address buffer unit 24c accordingly change one of the column address predecoded signals. The column address predecoded signals CA0 to CAm are latched by the input buffer circuits 270a, and the predecoding circuit 270b produces the address predecoded signal Ari/CARi to Arj/CArj at time t21.

The column address buffer unit 24c further supplies the column address predecoded signals CA0 and CAm to the address transition detecting circuits 281 and 28m, respectively, and the address transition detecting circuit 281 acknowledges the address transition of the column address predecoded signal CA0. Then, the address transition detecting circuit 281 produces the one-shot pulse signal ATDC0, and the address transition detecting sub-unit 28A changes the address transition detecting signal ATDA to the active low voltage level at time t22. However, the column address predecoded signals CAj to CAm are not changed, and the address transition detecting sub-unit 28B keeps the address transition detecting signal ATDB at the high voltage level.

As described hereinbefore, the address transition detecting signals ATDA and ATDB are supplied to the p-channel enhancement type charging transistors Qp13 and Qp14, respectively. Although the address transition detecting signal ATDB allows the p-channel enhancement type charging transistor Qp14 to remain off, the p-channel enhancement type charging transistor Qp13 turns on in the presence of the address transition signal ATDA of the active low voltage level, and the decoding signal 270e charges to the high voltage level at time t23.

Figure 8:
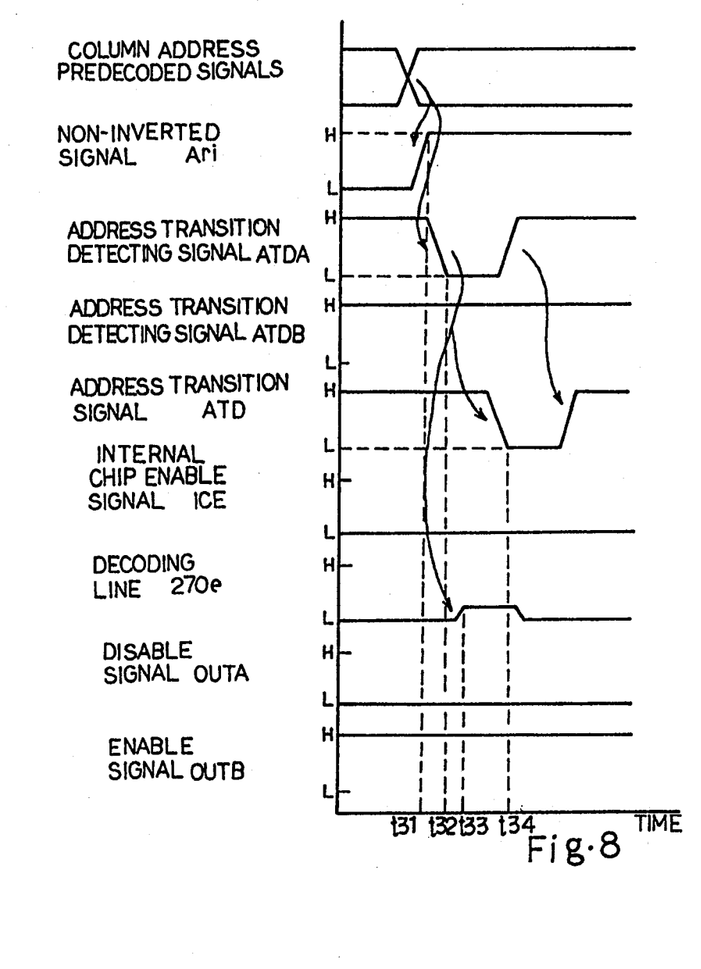
FIG. 8 is a diagram showing a data access sequence on a regular memory cell according to the present invention.

On the other hand, if the external device Ex accesses a data bit stored in a column of excellent regular memory cells not replaced with any redundant memory cells, the address transition detecting unit 28 and the redundant column address decoding unit 27b behave as illustrated in FIG. 8.

The external column address bits are changed to indicate the column address assigned to the column of excellent regular memory cells, and the column address buffer unit 24c supplies the column address predecoded signals CA0 to CAm to the input buffer unit 270a. The predecoding circuit 270b produces the non-inverted signals and the complementary signals thereof Ari/CARi to Arj/CArj at time t31.

The column address buffer unit 24c further supplies the column address predecoded signals CA0 to CAm to the address transition detecting circuits 281 to 28m, respectively, and the address transition detecting sub-unit 28A acknowledges the address transition to the new column address. Then, the address transition detecting sub-unit 28A changes the address transition detecting signal ATDA to the active low voltage level at time t32. However, the column address signals CAj to CAm are not changed, and the address transition detecting sub-unit 28B keeps the address transition detecting signal ATDB at the high voltage level.

Current flows from the power voltage line Vdd through the p-channel enhancement type charging transistor Qp13 to the decoding line 270e, and the decoding line 270e is charged to the high voltage level.

However, the non-inverted and complementary signals Ari/CAri to Arj/CArj cause at least one n-channel enhancement type switching transistor coupled with the non-broken fuse element to turn on, and the decoding line 270e is balanced at a relatively low voltage level at time t33.

The input nodes of the NAND gate 28za are set to logic "1" level and logic "0" level, and the NAND gate 28za changes the output node thereof to logic "1" level. Accordingly, the inverter 28zb changes the address transition signal ATD to logic "0" level at time t34.

The decoding line 270e at the low voltage level cause the output buffer circuit 270f to keep the disable signal OUTA and the enable signal OUTB inactive, and the regular column address decoder unit 24d decodes the column address predecoded signals so that the regular column selector unit 24e couples the selected bit line pair with the read/write data bus DL. On the other hand, the redundant column selector unit 27c is never enabled, and the redundant bit line pair RBL is isolated from the read/write data bus DL.

As will be appreciated from the foregoing description, the redundant column address decoding unit 27b starts the discriminative sequence for the replacement before the address transition signal ATD takes place, and the access to the data information is accelerated.

Second Embodiment

Figure 9:
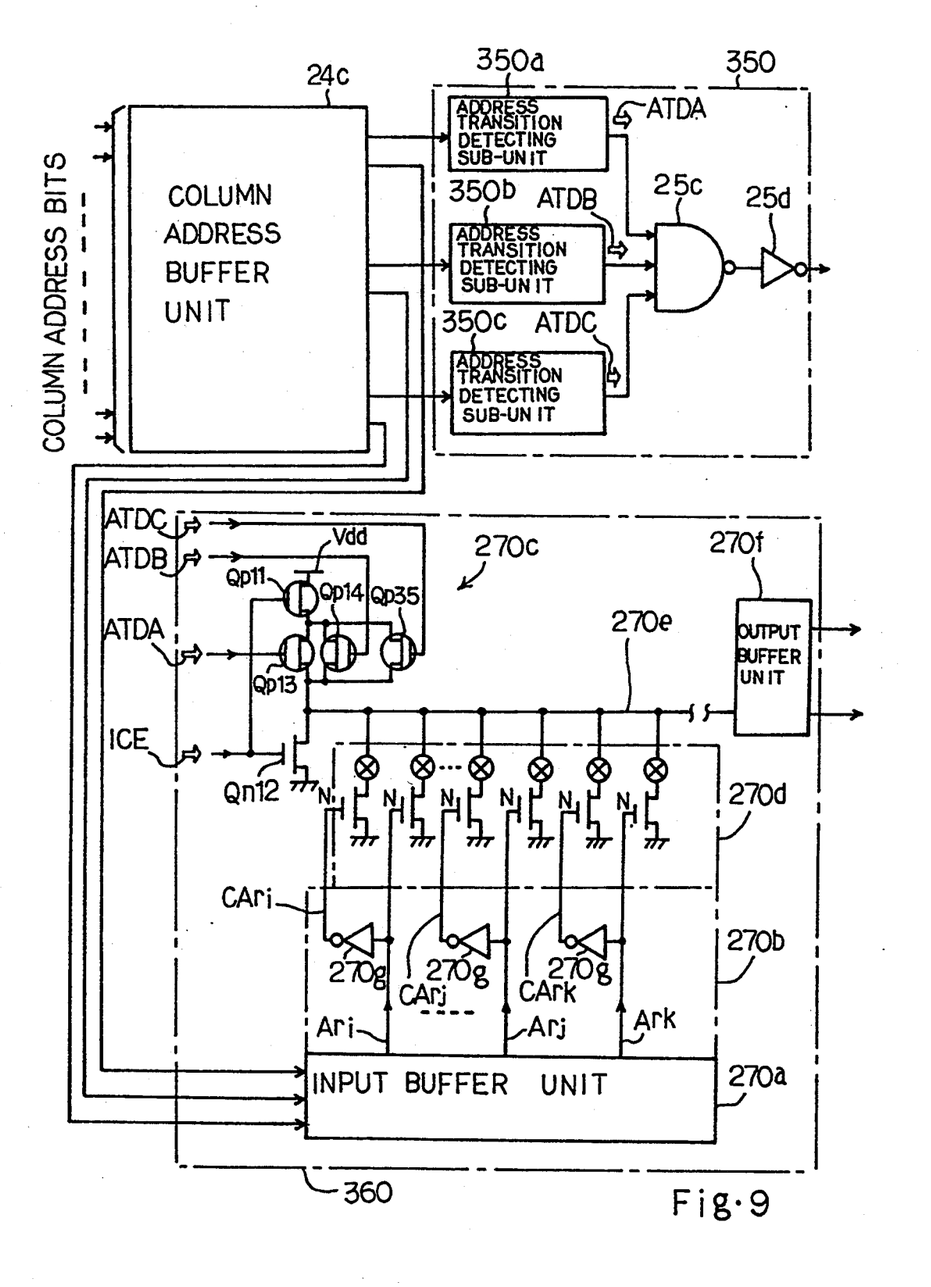
FIG. 9 is a circuit diagram showing an address transition detecting unit and a redundancy decoding unit incorporated in another semiconductor memory device according to the present invention.

Turning to FIG. 9 of the drawings, an address transition detecting unit 350 and a redundant column address decoding unit 360 are incorporated in another semiconductor memory device embodying the present invention. The semiconductor memory device implementing the second embodiment is similar to the first embodiment except for the column address predecoded signals are distributed to three address transition detecting sub-units 350a, 350b and 350c, and a p-channel enhancement type charging transistor Qp35 is, accordingly, added to the redundant column address decoding unit 360. The other components are labeled with the same references as those of the first embodiment without any detailed description for the sake of simplicity.

The circuit behavior of the second embodiment is analogous to the first embodiment, and all of advantages of the first embodiment are achieved by the second embodiment. Moreover, the second embodiment discriminates an address transition earlier than the first embodiment, because the circuit components of each address transition detecting sub-unit is less than that of the address transition detecting sub-unit of the first embodiment.

Although particular embodiments of the present invention have been shown and described, it will be obvious to those skilled in the art that various changes and modifications may be made without departing from the spirit and scope of the present invention. For example, the address transition detecting circuit may be more than three. The present invention is applicable to any type of semiconductor memory device in so far as an access is triggered by an address transition.

What is claimed is:

1. A semiconductor memory device comprising:
   a) a plurality of regular memory cells arranged in a plurality of addressable regular memory cell groups;
   b) at least one redundant memory cell group with which one of said plurality of addressable regular memory cell groups is replaced;
   c) a regular addressing system associated with said plurality of addressable regular memory cell groups, and responsive to address signals indicative of an address assigned to one of said addressable regular memory cell groups for allowing an external device to access data information stored therein;
   d) an address transition detecting unit having
      d-1) a plurality of address transition detecting sub-units supplied with said address signals, and operative to check said address signals to see whether or not at least one address signal changes the logic level for producing respective output signals each indicative of a change of said at least one address bit or not, and
      d-2) a logic unit having a plurality of input nodes respectively coupled with said plurality of address transition detecting sub-units, and producing an address transition signal from said output signals; and
   e) a redundancy unit associated with said redundant memory cell group, and having
      e-1) a decoding line,
      e-2) a precharging circuit having a plurality of charging transistors coupled in parallel between a source of current and said decoding line, said plurality of charging transistors being gated by said output signals of said plurality of address transition detecting sub-units, respectively,
      e-3) a memory and decoding circuit storing the address of one of said plurality of addressable regular memory cell groups replaced with said at least one redundant memory cell group, and comparing the address indicated by said address signals with said address stored therein to see whether or not said addresses are inconsistent with one another for determining to provide a current path between said decoding line and a constant voltage line or not, and
      e-4) a means coupled with said decoding line, and allowing said at least one redundant memory cell group to be accessible instead of said one of said plurality of addressable regular memory cell groups when said decoding line is electrically isolated from said constant voltage line, said means being further operative to keep said at least one redundant memory cell group non-accessible when said decoding line is coupled through said current path with said constant voltage line.

2. A semiconductor memory device as set forth in claim 1, in which said precharging circuit further comprises a first switching transistor coupled between said source of current and said plurality of charging transistors and responsive to an internal chip enable signal of an active level indicative of an access to data information stored in the semiconductor memory device, and a second switching transistor coupled between said decoding line and a discharging line and responsive to said internal chip enable signal of an inactive level for discharging said decoding line.

3. A semiconductor memory device as set forth in claim 1, in which said memory and decoding circuit comprises a plurality pairs of breakable fuse elements coupled to said decoding line and selectively broken for memorizing said address assigned to said one of said addressable memory cell groups, and a plurality pairs of switching transistors coupled in parallel between said plurality pairs of breakable fuse elements and said constant voltage line and gated by internal address signals indicative of the address represented by said external address bits.

4. A memory device comprising:
   a cell array having a plurality of memory cells, and divided into a first cell block and a second cell block;
   a buffer unit operative to receive a plurality of address signals for selecting one of said plurality of memory cells;
   an input and output unit operative to receive said plurality of address signals supplied from said buffer unit, enabled with a first control signal, and responsive to a second control signal for accessing one of said first cell block and said second cell block;
   a detecting unit having a plurality of transition detecting circuits respectively receiving said plurality of address signals supplied from said buffer unit for detecting a transition of said plurality of address signals, said plurality of transition detecting circuits being divided into a first group and a second group, each implemented by transition detecting circuits;
   an input and output instruction unit having
      a first logic circuit supplied with outputs from the transition circuits of said first group,
      a second logic circuit supplied with outputs from the transition circuits of said second group, and
      a third logic circuit supplied with an output of said first logic circuit and an output of said second logic circuit for producing said first control signal; and
   a cell block instruction unit having
      a fourth logic circuit supplied with said output of said first logic circuit and the output of said second logic circuit for producing an internal control signal independently from said third logic circuit, and
   an output circuit activated by said internal control signal for producing said second control signal.

* * * * *